United States Patent [19]

Matsumoto et al.

[11] Patent Number: 5,369,486
[45] Date of Patent: Nov. 29, 1994

[54] POSITION DETECTOR FOR DETECTING THE POSITION OF AN OBJECT USING A DIFFRACTION GRATING POSITIONED AT AN ANGLE

[75] Inventors: Takahiro Matsumoto; Noriyuki Nose, both of Atsugi; Minoru Yoshii, Tokyo; Kenji Saitoh, Yokohama; Masanobu Hasegawa, Fujisawa; Koichi Sentoku, Atsugi, all of Japan

[73] Assignee: Canon Kabushiki Kaisha, Tokyo, Japan

[21] Appl. No.: 947,383

[22] Filed: Sep. 21, 1992

[30] Foreign Application Priority Data

Sep. 27, 1991 [JP] Japan ................... 3-276953

[51] Int. Cl.$^5$ .................................. G01B 9/02
[52] U.S. Cl. ........................ 356/349; 356/363; 356/356
[58] Field of Search ............... 356/349, 356, 358, 399, 356/400, 401, 363; 250/572

[56] References Cited

U.S. PATENT DOCUMENTS 4,710,026 12/1987 Magome et al. .
5,000,573  3/1991 Suzuki et al. ........................ 356/349
5,114,236  5/1992 Matsugu et al. .
5,148,037  9/1992 Suda et al. .

FOREIGN PATENT DOCUMENTS 1405362 9/1975 United Kingdom .

OTHER PUBLICATIONS

IBM Technical Disclosure Bulletin, vol. 32, No. 10B, Mar. 1990, pp. 214–217; "Interferometric Method of Checking the Overlay Accuracy in Photolithographic Exposure Processes".

Primary Examiner—Samuel A. Turner
Assistant Examiner—Robert Kim
Attorney, Agent, or Firm—Fitzpatrick, Cella, Harper & Scinto

[57] ABSTRACT

A position detector includes a diffraction grating provided on the surface of an object, an illumination system for illuminating the diffraction grating, a detection system for detecting diffracted light diffracted from the diffraction grating, and a processing system for detecting positional information relating to the object. The illumination system emits a first pair of beams which are diffracted by the diffraction grating and interfere with each other, and emits a second pair of beams which are diffracted by the diffraction grating and also interfere with each other. The first pair of beams are incident upon the diffraction grating along a plane extending in a first direction in which the diffraction grating extends. The second pair of beams are incident upon the diffraction grating along a plane extending in a second direction in which the diffraction grating extends. The first and second directions are different from a grating line direction. The detection system detects the interfering light and generates first and second beat signals therefrom. The processing system detects positional information with respect to the first direction from the phase state of the first beat signal and with respect to the second direction from the phase state of the second beat signal.

7 Claims, 8 Drawing Sheets

POSITION DETECTOR FOR DETECTING THE POSITION OF AN OBJECT USING A DIFFRACTION GRATING POSITIONED AT AN ANGLE

BACKGROUND OF THE INVENTION

1. Field of the Invention

This invention relates to a position detector used to, for example, position a mask and a wafer on an apparatus for an exposure process for manufacturing semiconductor devices or to measure the accuracy of the superposition of semiconductor patterns.

2. Description of the Prior Art

FIG. 1 shows a conventional position detector based on an optical heterodyne method using a rectilinear diffraction grating as a positioning mark. A beam of light L1 emitted from a two-wavelength rectilinear polarization laser source 1 travels to a diffraction grating 2. Beams of 0th-order diffracted light L2, 1st-order diffracted light L3 and −1st-order diffracted light L4 from the diffraction grating 2 are deflected by a mirror 3. During the passage through an illumination optical system 4, one of these diffracted light beams is cut while the direction of polarization of one of the other light beams is changed by a half-wave plate. The diffracted light beams are then led to a diffraction grating 6 on a mask 5 and a diffraction grating on a wafer 7 at an angle determined by the numerical aperture (NA) of the illumination optical system 8. A first light beam L5 reflected and diffracted by the diffraction grating 6 and a second light beam L6 reflected and diffracted by the diffraction grating 8 travel in the same direction but they are not exactly superposed because the diffraction gratings 6 and 8 are shifted relative to each other in the y-axis direction. The wafer 7 is driven with a wafer stage 11 and a wafer stage drive circuit 12, while the mask 5 is driven with a mask stage 9 and a mask stage drive circuit 10.

A polarization beam splitter 14 splits light beams L5 and L6. Light from light beams L5 and L6 having the same polarization direction is reflected toward a first detection means 13. However, a knife edge 15 prevents light from light beam L6 from reaching first detection means 13. As a result, first detection means 13 only receives light from light beam L5. Similarly, polarization beam splitter 14 transmits light having the same polarization direction toward a second light detection means 16. However, a knife edge 17 prevents light from light beam L5 from reaching second light detection means 16. As a result, second light detection means 16 only receives light from light beam L6. Beat signals of light detected by the first and second detection means 13 and 16 are supplied to a phase difference meter 18, and outputs from the phase difference meter 18 are input to stage drive circuits 10 and 12.

The principle of positioning the mask 5 and the wafer 7 will be described below with reference to FIGS. 2(a) and 2(b) which are sectional and plan views of the diffraction grating 6 and the mask 5. Composite light Em of a −1st-order diffracted light beam having a frequency f1 and a 1st-order diffracted light beam having a frequency f2 is expressed by the following equation (1):

$$Em = A1\exp\{i(2\pi f1 \cdot t - \delta m)\} + A2\exp\{i(2\pi f2 + \delta m)\} \quad (1)$$

where $\delta m = 2p \cdot \Delta Xm/p$ (p: the pitch of diffraction gratings 6 and 8) and A1 and A2 are constants determined experimentally. The variable $\delta m$ depends upon a displacement $\Delta Xm$ of the first diffraction grating 6 in the x-axis direction. If the intensity of light Im of the composite light Em is detected, it is expressed by the following equation (2):

$$Im = |Em|^2 = A1^2 + A2^2 + 2A1 \cdot A2 \cos\{2\pi(f1-f2)t - 2\delta m\} \quad (2)$$

If the diffraction grating 6 is moved by $\Delta Xm$, the phase of the light beat signal given by the equation (1), i.e., the phase represented by the third term in the equation (2) is changed by $4\pi\Delta Xm/p$. It is possible to detect the extent of movement $\Delta Xm$ of the diffraction grating 6 by detecting this light beat signal. It is also possible to detect the extent of movement $\Delta Xw$ in the x direction of the diffraction grating 8 in the same manner.

The light beat signal Iw detected by the second detection means 16 represents the intensity of composite light of a 1st-order diffracted light beam having a frequency f1 and a −1st-order diffracted light beam having a frequency f2. If $\delta w = 2\pi\Delta Xw/p$, the intensity Iw can be expressed by the following equation (3):

$$Iw = A1^2 + A2^2 + 2A1 \cdot A2 \cos\{2\pi(f1-f2)t - 2\delta w\} \quad (3)$$

The phase difference $\Delta\phi$ between the light beat signal detected by the first detection means 13 and expressed by the equation (2) and the light beat signal detected by the second detection means 16 and expressed by the equation (3) is expressed by the following equation (4):

$$\Delta\phi = 4\pi(\Delta Xm - \Delta Xw)/p \quad (4)$$

Consequently, the phase difference between the mask diffraction light beat signal and the wafer diffraction light beat signal is detected and the mask stage 9 and the wafer stage 11 are moved relative to each other so that this phase difference becomes 0, thereby accurately positioning the mask 5 and the wafer 7.

In a conventional method for actually measuring and evaluating the positioning performance of an apparatus assembled as an exposure apparatus, a fine pattern formed on a mask is superposed and printed on a wafer and a shift of the pattern on the wafer is measured, as described below.

FIGS. 3(a) and 3(b) show a means for measuring only a shift in a direction along the x-axis, i.e., patterns P1 and P2, each of which is, for example, a resist pattern formed by exposure on a wafer. The patterns P1 and P2 form a sub scale, the division of which corresponds to 0.05 μm. The pattern P1 has a pitch of 7.95 μm, while the pattern P2 has a pitch of 8.00 μm. A surface of the wafer is first exposed to light through a first mask (reticle) to form the pattern P1, and the pattern image is developed. Thereafter, resist is applied and a second mask (reticle) having the pattern P2 is aligned on the wafer. The wafer surface is then exposed to form the second pattern P2. The patterns P1 and P2 are thereby superposed as shown in FIG. 3(c). The patterns P1 and P2 are observed by being magnified with a microscope to read the error in superposing the first and second masks (reticles) by alignment.

In the conventional positioning apparatus based on the optical heterodyne method, however, four alignment patterns, i.e., two pairs of rectilinear diffraction gratings on the mask and the wafer are required if there are two positioning direction axes. Also, in the conventional superposition accuracy measuring apparatus using sub scales, it is necessary to measure superposition shifts along the two axes and therefore to separately form, on the wafer, sub scale patterns for measurement in the two directions.

SUMMARY OF THE INVENTION

It is the object of the present invention is to overcome the problems of the prior art.

It is a further object of the present invention to provide a position detector capable of detecting positional errors in a plurality of directions by using diffraction gratings having diffraction line directions inclined relative to the plurality of position detection directions.

It is still another object of the present invention to provide a position detector capable of measuring a shift in an x-axis direction or a y-axis direction of an object.

It is another object of the present invention to provide a position detector which can detect a shift of an object in the x-axis direction and the y-axis direction using less than two pairs of rectilinear diffraction gratings.

It is still another object of the present invention to provide a position detector which can detect the position of an object in the x-axis and the y-axis direction without the necessity to measure superposition shifts along two axis or to separately form sub scale patterns for measurement in two directions on the object.

According to one aspect, the present invention which achieves at least one of these objectives relates to a position detector comprising a diffraction grating provided on a surface of an object, the diffraction grating having a plurality of grating lines extending in a grating line direction, the detector comprising an illumination system for emitting a first pair of light beams, for forming a first beat signal, so that the light beams are incident upon the diffraction grating along a plane extending in a first direction in which the diffraction grating extends, different from the grating line direction, and so that the first pair of light beams are diffracted by the diffraction grating and interfere with each other, the illumination system also for emitting a second pair of light beams, for forming a second beat signal, so that the second pair of light beams are incident upon the diffraction grating along a plane extending in a second direction in which the diffraction grating extends, different from each of the grating line direction and the first direction so that the second pair of light beams are diffracted by the diffraction grating and interfere with each other, a detection system for detecting diffracted and interfering light from the first pair of light beams and for generating a first beat signal therefrom, the detection system also for detecting diffracted and interfering light from the second pair of light beams and for generating a second beat signal therefrom, and a processing system for detecting position information with respect to the first direction of the diffraction grating from the phase state of the first beat signal, the processing system also for detecting position information with respect to the second direction of the diffraction grating from the phase state of the second beat signal.

The first and second directions are perpendicular to each other, and the grating line direction is inclined approximately at an angle of 45° from the first and second directions.

The illumination system comprises a single Zeeman laser light source, a single beam splitter and at least one mirror, and one of the illumination and detection systems and the object is rotated by an angle of 90° to enable the first and second pairs of light beams to be incident upon diffraction grating.

According to another aspect, the present invention which achieves these objectives relates to a position detector comprising a diffraction grating provided on a surface of an object, the diffraction grating having a plurality of grating lines extending in a grating line direction, and illumination system for emitting a first pair of light beams, for forming a first beat signal, so that the light beams are incident upon the diffraction grating along a plane extending in a first direction in which the diffraction grating extend, different from the grating line direction and so that the first pair of light beams are diffracted by the diffraction grating and interfere with each other, the illumination system also for emitting a second pair of light beams, for forming a second beat signal, so that the second pair of light beams are incident upon the diffraction grating along a plane extending in a second direction in which the diffraction grating extends, different from each of the grating line direction and the first direction so that the second pair of light beams are diffracted by the diffraction grating and interfere with each other, a detection system for detecting diffracted and interfering light from the first pair of light beams and for generating a first beat signal therefrom, the detection system also for detecting diffracted and interfering light from the second pair of light beams and for generating a second beat signal therefrom, comparison beat signal formation means for extracting a part of the first pair of light beams to form a third beat signal and for extracting a part of the second pair of light beams to form a fourth beam signal, and a processing system for detecting position information with respect to the first direction of the diffraction grating from the phase difference between the first and third beat signals, the processing system also for detecting position information with respect to the second direction of the diffraction grating from the phase difference between the second and fourth beat signals.

The comparison beat signal formation means causes a part of each of the first and second pairs of light beams to be incident upon a comparison diffraction grating provided at a position different from that of the diffraction grating, and forms the third and fourth beat signals from diffracted light from the comparison diffraction grating.

The first and second directions are perpendicular to each other, and the grating line direction is inclined approximately at an angle of 45° from the first and second directions.

The illumination system comprises a single Zeeman laser light source, a single beam splitter and at least one mirror, and one of the illumination and detection systems and the object is rotated by an angle of 90° to enable the first and second pairs of light beams to be incident upon the diffraction grating.

According to still a further aspect, the present invention which achieves these objectives relates to a position detector comprising a first illumination system for causing a light beam to be incident upon a surface of an object along a plane extending in a first direction in which the object extends to obtain position information with respect to the first direction, a second illumination system for causing a light beam to be incident upon a surface of the object along a plane extending in a second direction in which the object extends to obtain position information with respect to the second direction, and a diffraction grating for diffracting both the light beam along the plane extending in the first direction and the light beam along the plane extending in the second direction, the diffraction grating being provided on the object, wherein the diffraction grating has grating lines extending in a direction different from each of the first and second directions.

The foregoing and other objects, advantages, and features of the present invention will become more apparent from the following detailed description of preferred embodiments taken in conjunction with the accompanying drawings.

DESCRIPTION OF THE PREFERRED EMBODIMENTS

Figure 1:
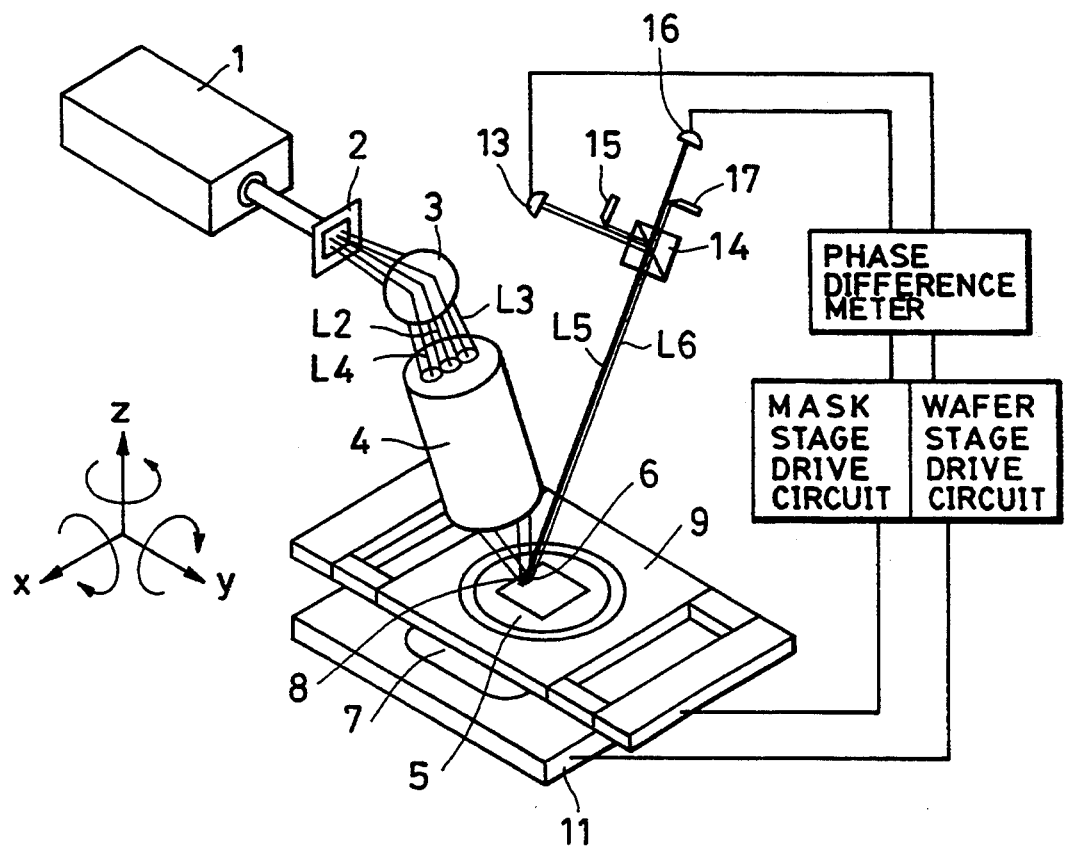
FIG. 1 is a schematic diagram of the construction of a conventional positioning apparatus.
Figure 2A:
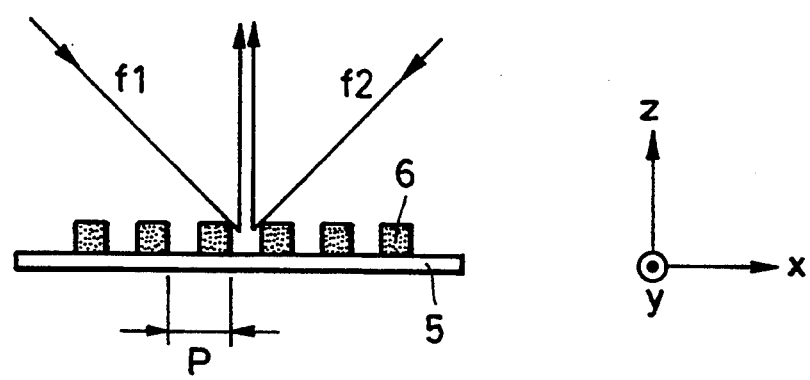
FIGS. 2(a) and 2(b) are diagrams of the principle of positioning a mask and a wafer.
Figure 2B:
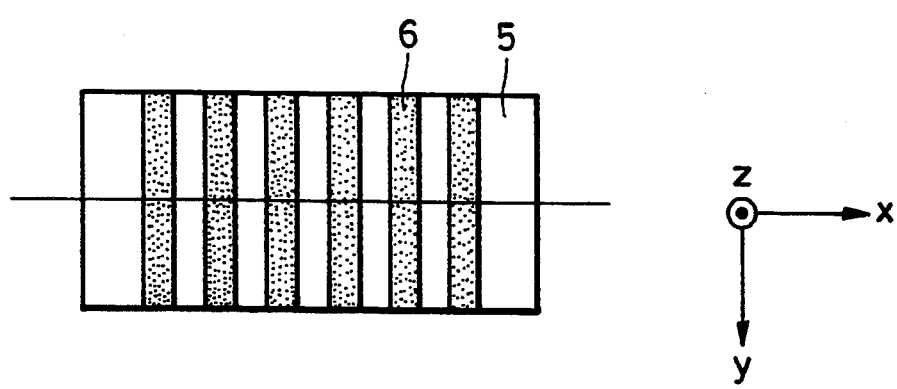
Figure 3A:
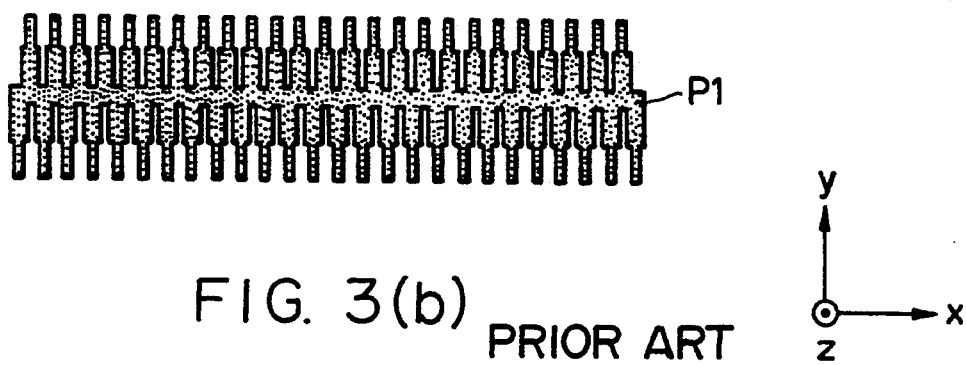
FIGS. 3(a) to 3(c) are diagrams of the conventional method of measuring the semiconductor superposition accuracy.
Figure 3B:
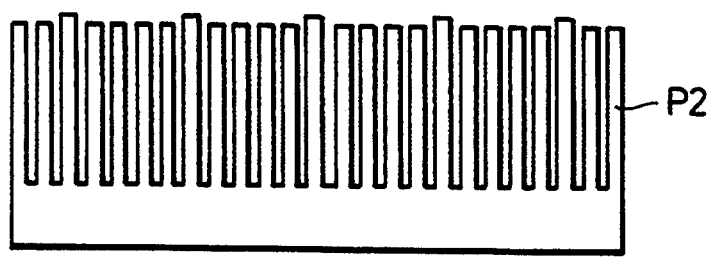
Figure 3C:
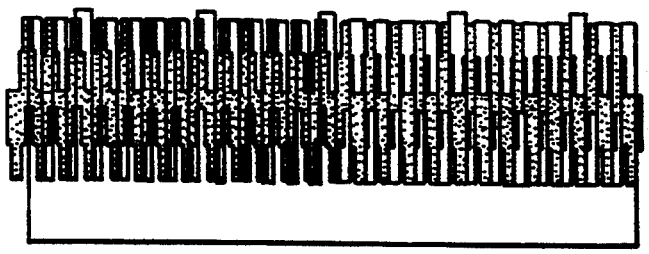
Figure 4:
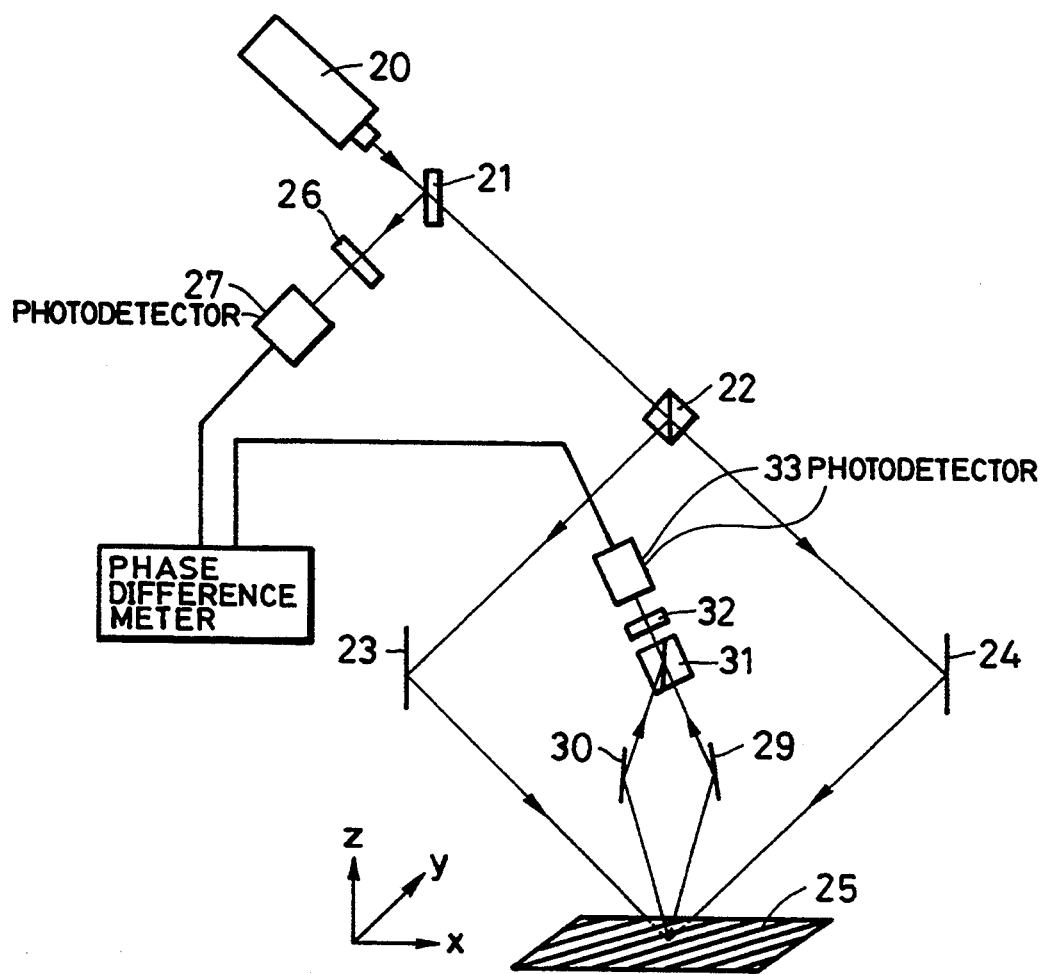
FIG. 4 is a schematic diagram of the basic principle of the present invention.

FIG. 4 is a diagram of the basic principle of the present invention. Two light beams emitted from a two-frequency Zeeman light source 20 and having frequencies f1 and f2 slightly different from each other are separated into straight-traveling light and reflected light by beam splitter 21. The straight-traveling light is divided into two light beams by a polarized light beam splitter 22 to respectively irradiate an obliquely-scribed diffraction grating 25 via mirrors 23 and 24, i.e., to form an illumination system with the elements in the optical path from the light source 20 to the diffraction grating 25. Reflected light from the beam splitter 21 travels to a photodetector 27 through a Glan-Thompson prism 26. An output terminal of the photodetector 27 is connected to one of two input terminals of a phase difference meter 28. On the other hand, the two reflected light beams from the diffraction grating 25 travel to a polarized light beam splitter 31 via mirrors 29 and 30 to be combined into one light beam which travels to a photodetector 33 through a Glan-Thompson prism 32. That is, a detection system is formed by the elements in the optical path from the diffraction grating 25 to the photodetector 33. An output terminal of the photodetector 33 is connected to the phase difference meter 28. The difference between the phase of a beat signal as a detection output from the photodetector 27 and the phase of a beat signal as a detection output from the photodetector 33 is calculated by the phase difference meter 28.

Figure 5A:
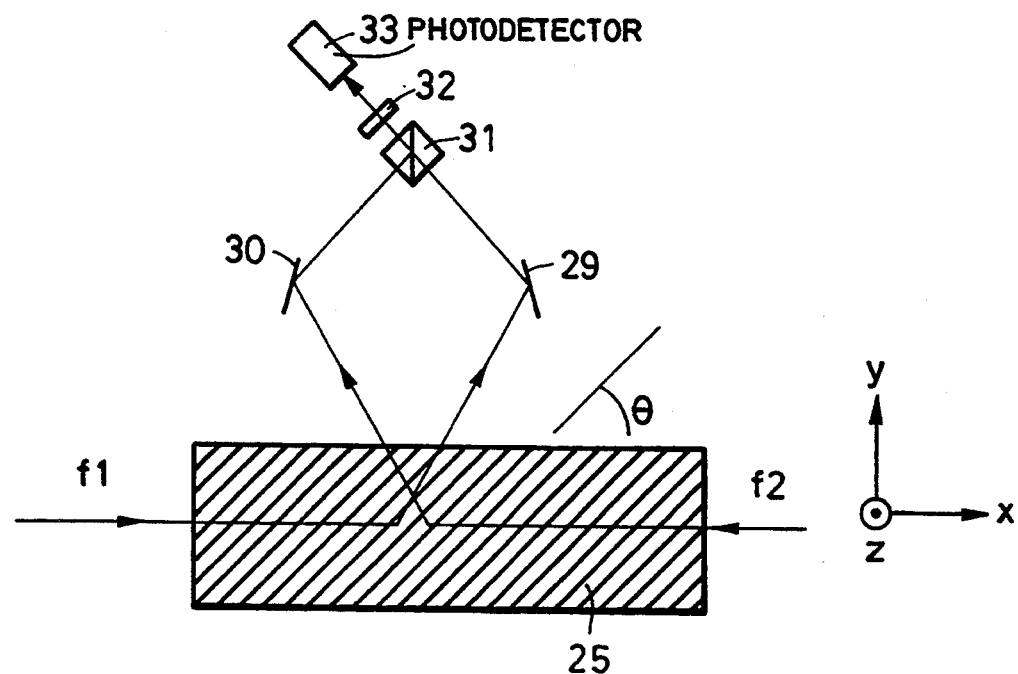
FIGS. 5(a) and 5(b) are diagrams of the measuring method in accordance with the present invention.
Figure 5B:
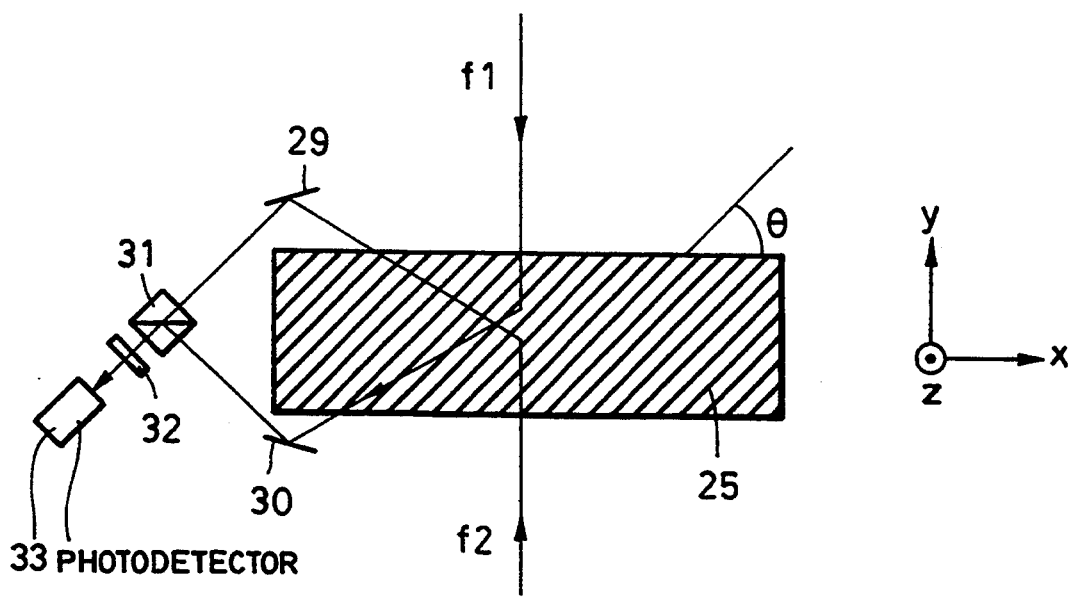

FIGS. 5(a) and 5(b) are diagrams of the optical paths of the incident light and the diffracted light viewed in the direction of the z-axis. The method of measuring the positional error in the x-axis direction will first be described below with reference to FIG. 5(a). The beam of s-polarized light having frequency f1 and the beam of p-polarized light having frequency f2 are incident upon the diffraction grating 25 in the xz plane defined by the x-axis corresponding to the error measuring direction and a normal (z-axis) to the diffraction grating 25. Particular diffracted light from the diffraction grating 25 is deflected by the mirrors 29 and 30 to be led to the polarized light beam splitter 31. Because the polarized beam splitter 31 reflects s-polarized light while transmitting p-polarized light, the particular diffracted light of the beams having frequencies f1 and f2 travels through the same optical path. The Glan-Thompson prism 32 is placed in the same optical path to cause interference between the light beams having frequencies f1 and f2 while making the polarization planes of these light beams uniform. Since the frequencies of the two beams are slightly different, the photodetector 33 detects a beat of frequency f1−f2, i.e., outputs a beat signal.

The light emitted from the light source 20 and having frequencies f1 and f2 can be expressed as complex amplitudes U1 and U2 by the following equations (5) and (6):

$$U1 = A \exp\{i(\omega 1 t + \phi 1)\} \quad (5)$$

$$U2 = B \exp\{i(\omega 2 t - \phi 2)\} \quad (6)$$

where A and B represent the amplitudes, ω1 and ω2 represent the angular frequencies, $\omega 1 = 2\pi f1$, and $\omega 2 = 2\pi f2$.

FIG. 5(a) shows the method of measuring the positional error in the x-axis direction, assuming that diffracted light on the right hand side of the direction of traveling of 0-order diffracted light (positive reflected light) as viewed from the +z-axis side of the grating 25 (above the sheet containing FIG. 5(a)), i.e., the light beam having frequency f2, is +m-order diffracted light, while diffracted light on the left hand side of the direction of traveling of 0-order diffracted light as viewed from the +z axis side of the grating 25 (above the sheet containing FIG. 5(a)), i.e., the light beam having frequency f1, is −m-order diffracted light. Generally, if the oblique diffraction grating 25 in which grating lines are scribed in the direction at an angle θ with respect to the x axis as shown in FIG. 5(a), is moved by X1 in the x-axis direction relative to a reference position, and if the pitch of the diffraction grating 25 is p, then the 1st-order diffracted light and the −1st-order diffracted light have phases of $(2\pi/p \cos \theta)X1$, and $-(2\pi/p \cos \theta)X1$, respectively.

Accordingly, complex amplitudes U1' and U2' of the 1st-order diffracted light and the −1st-order diffracted light from the diffraction grating 25 of the light beams having complex amplitudes U1 and U2 can be expressed by the following equations (7) and (8):

$$U1' = A' \exp\{i(\omega 1 t + \phi 1 + \phi)\} \quad (7)$$

$$U2' = B' \exp\{i(\omega 2 t + \phi 2 - \phi)\} \quad (8)$$

where A' and B' represent the amplitudes and $\phi=(2\pi/p \cos\theta)X1$. The change V1 in the intensity of the beat signal as a photoelectric detection output from the photodetector 33 after the polarization planes of the beams diffracted by grating 25 and reflected or transmitted by splitter 31 have been made uniform by the Glan-Thompson prism 32 is expressed by the following equation (9):

$$V1 = A'^2 + B'^2 + 2A' \cdot B' \cos\{(\omega 1 - \omega 2)t + (\phi 1 - \phi 2) + 2\phi\} \quad (9)$$

The light beams having frequencies f1 and f2, reflected by the beam splitter 21 and traveling through the optical path not leading to the diffraction grating 25 travel through the Glan-Thompson prism 26 to be photoelectrically detected by the photodetector 27. The change V1 in the intensity of the beat signal from the photodetector 27 is expressed by the following equation (10):

$$V2 = C^2 + D^2 + 2C \cdot D \cos\{(\omega 1 - \omega 2)t + (\phi 1 - \phi 2)\} \quad (10)$$

where C and D are the amplitudes of the light beams having frequencies f1 and f2, respectively.

The two beat signals are input to the phase difference meter 28 to measure the phase difference therebetween. As can be understood from the equations (9) and (10), the initial phase difference $\phi 1 - \phi 2$ between the light beams having frequencies f1 and f2 is canceled out and only the phase difference corresponding to the shift X1 of the diffraction grating 25 in the x-axis direction appears as the phase difference between the two beat signals. Consequently, the shift X1 of the diffraction grating 25 in the x-axis direction can be obtained by the following equation (11) from a phase difference $\Delta Tx$ measured with the phase difference meter 28.

$$X1 = (p \cos\theta/4\pi)\Delta Tx \quad (11)$$

The method of measuring the positional error in the y-axis direction will next be described below. Another set of illumination, detection and processing systems, which is not illustrated in FIG. 4 but which is the same as that for measuring the shift in the x-axis direction, i.e., the set of the elements shown in FIG. 4 other than the diffraction grating 25, is disposed in a position rotated by 90° about the axis z with respect to the position of these elements shown in FIG. 4. With respect to the measurement of the shift in the x-axis direction, if diffracted light traveling through optical paths symmetrical about the yz plane as shown in FIG. 5(a) is used, the measurement can be performed without including a shift of the diffraction grating 25 in the y-axis direction as an error.

To measure a shift in the y-axis direction, two light beams having frequencies f1 and f2 are provided so as to be incident upon the diffraction grating 25 in the yz plane. Subsequently, in the same manner as the measurement of the shift in the x-axis direction, diffracted light beams from the diffraction grating 25 are deflected by mirrors 29 and 30, are made by polarized beam splitter 31 to travel in the same optical path, and interfere with each other while their polarization planes are made uniform by the Glan-Thompson prism 32. Photodetector 33 photoelectrically detects this light to obtain a beat signal.

The beat signal obtained by the photodetector 33 is input into the phase difference meter 28 along with the beat signal obtained by the interference of the two light beams having frequencies f1 and f2 and traveling through the optical path not leading to the diffraction grating 25. The shift in the y-axis direction can be obtained from the phase difference between these two beat signals. If the measured phase difference is $\Delta Ty$, the shift Y1 in the y-axis direction can be obtained from the following equation (12):

$$Y1 = (p \sin\theta/4\pi)\Delta Ty \quad (12)$$

For the measurement of the shift in the y-axis direction, diffracted light traveling through optical paths symmetrical about the xz plane may be used to enable the measurement to be performed without being influenced by an error due to a shift in the x-axis direction. In the above-described measuring method, two sets of illumination, detection and processing systems for measuring shifts in the x and y directions are provided. However, only one set of the illumination, detection and processing systems may be provided to measure shifts in the x-axis and y-axis directions in such a manner that the shift in the x-axis direction is first detected, and the illumination, detection and processing systems, i.e., the components shown in FIG. 4 other than the diffraction grating 25 are thereafter rotated by 90° about the z-axis or the member in which the diffraction grating are formed is rotated by 90° about the z-axis to measure the shift in the y-axis direction.

Thus, the diffraction grating having grating lines formed obliquely with respect to the positional error detecting directions are irradiated with light of two frequencies and the phase difference between beat signals obtained from diffracted light from the diffraction grating 25 is detected. A mark corresponding to one diffraction grating can therefore be used to independently measure shifts of the mark in the directions along two axes, i.e., the x- and y-axes. If a diffraction grating having pitch Pm = 2.0 μm and $\theta = 45°$ is used and if the resolution of the phase difference meter 28 is 1° the resolution of this measuring system is about 2 nm. When $\theta = 45°$ the amount of positional error in both the directions along the x- and y-axes can be measured with the desired accuracy. However, if it is desirable to measure the amount of positional errors in a direction, e.g., along the X axis with particularly high accuracy, $\theta > 45°$ may be set. The angle $\theta$ may be determined in this manner according to one's purpose.

Figure 6:
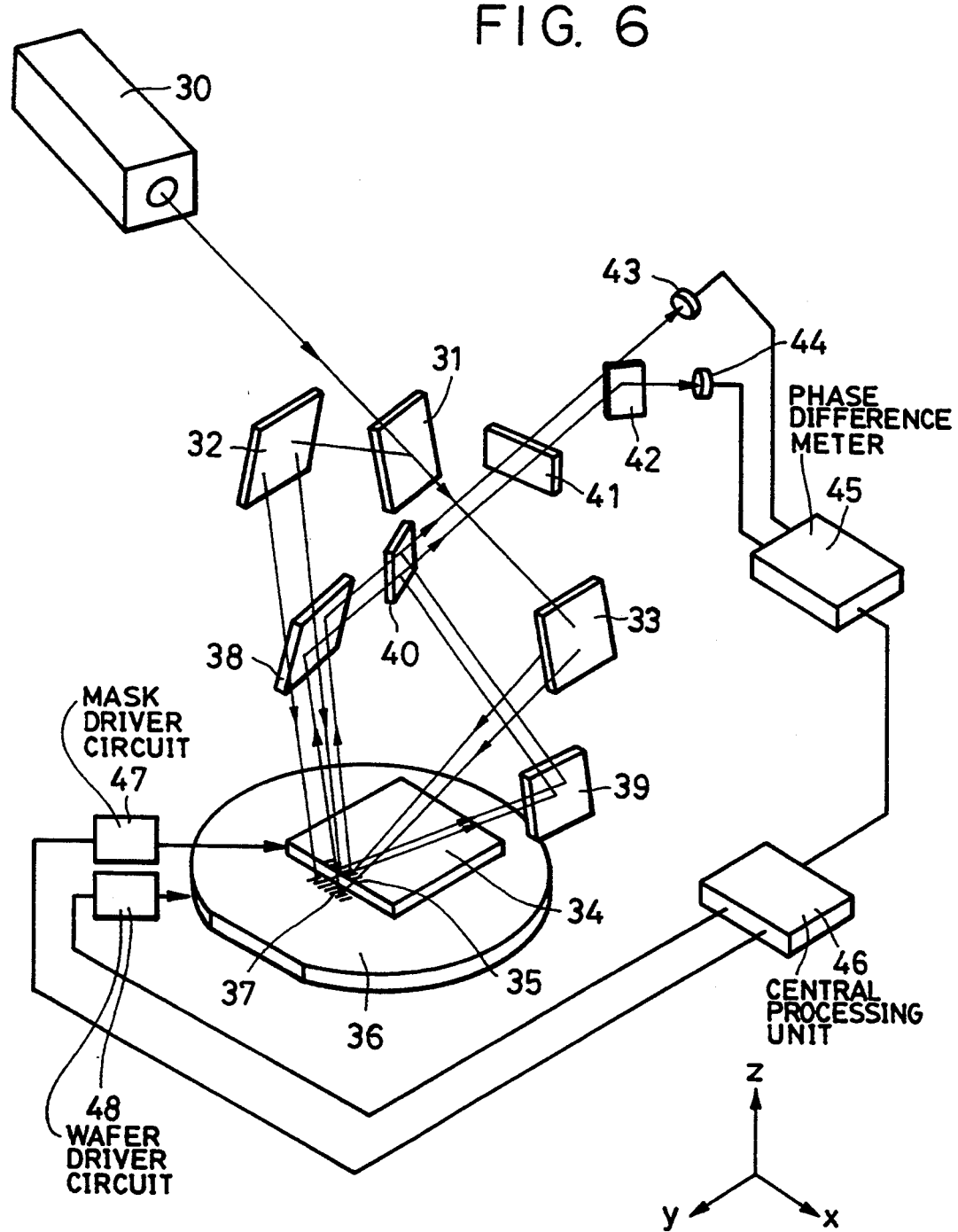
FIG. 6 is a schematic diagram of the construction of an embodiment of the present invention.
Figure 7:
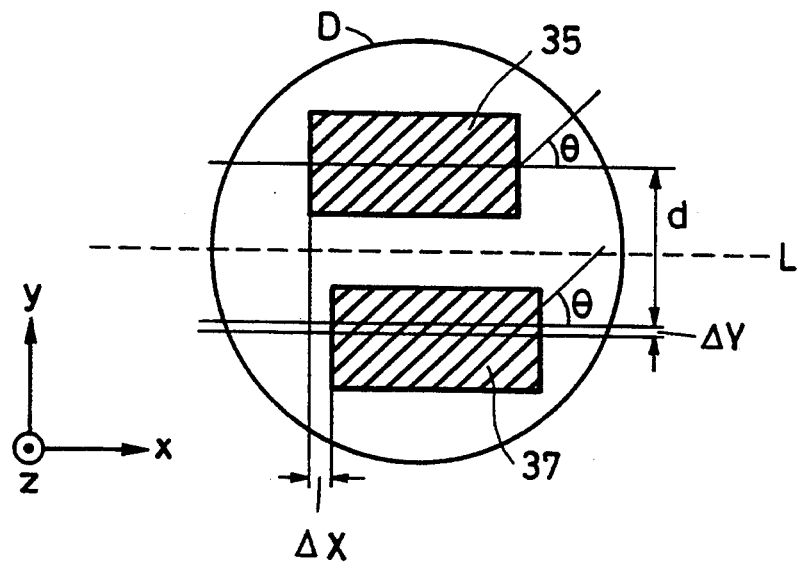
FIG. 7 is a plan view of diffraction gratings in accordance with the present invention.

FIGS. 6 and 7 show an embodiment in which the present invention is applied to an apparatus for positioning a mask and a wafer on a semiconductor exposure apparatus. FIG. 6 is a diagram of the construction of such a device and FIG. 7 is a plan view of a diffraction grating. Each of two light beams having different frequencies output from a Zeeman laser light source 30 is divided into two beams by a polarized beam splitter 31. The divided light beams travel via mirrors 32 and 33 to respectively irradiate a rectilinear diffraction grating 35 provided on a mask 34 and another rectilinear diffraction grating 37 provided on a wafer 36. Grating lines of these diffraction gratings 35 and 37 are obliquely formed so as to extend in the same direction, as shown in FIG. 7. Reflection light from diffraction gratings 35 and 37 travels via mirrors 38 and 39 to be condensed to a polarized beam splitter 40, and further travels through a Glan-Thompson prism 41. Further, the two light beams travel to photodetectors 43 and 44, with one of them traveling to photodetector 44 via an edge mirror 42. Outputs from the photodetectors 43 and 44 are supplied to a phase difference meter 45 formed of a lock-in amplifier or the like. An output from the phase difference meter 45 is supplied to a central processing unit (CPU) 46. The CPU 46 supplies command signals to a mask driver circuit 47 and a wafer driver circuit 48. It is not always necessary for the grating lines of the diffraction gratings 35 and 37 to be formed along the same direction. For example, the grating lines may be perpendicular to each other.

The light beams emitted from the Zeeman laser light source 30 in a state of being polarized perpendicularly to each other, i.e., beams of s-polarized light having a frequency f1 and p-polarized light having a frequency f2 travel to the polarized beam splitter 31. The s-polarized light having frequency f1 is reflected thereby, while the polarized light having frequency f2 passes therethrough. The diffraction gratings 35 and 37 are irradiated with these two light beams in the xz plane by the mirrors 32 and 33. The light beams diffracted by the diffraction gratings 35 and 37 are deflected by the mirrors 38 and 39, and the s-polarized diffracted light is reflected by the polarized beam splitter 40, while the p-polarized diffracted light passes through the polarized beam splitter 40. Thereafter, the two diffracted light beams from the diffraction grating 35 on the mask 34 are made to interfere with each other and the polarization planes thereof are made uniform by the Glan-Thompson prism 41 to obtain a light beat signal B1. The two diffracted light beams from the diffraction grating 37 on the wafer 36 are made to interfere with each other to obtain a light beat signal B2.

The two interfering light beams are spatially separated by using the edge mirror 42. Thereafter, the light from the diffraction grating 35 is photoelectrically detected by the photodetector 43 to obtain the light beat signal B1, while the light from the diffraction grating 37 is photoelectrically detected by the photodetector 44 to obtain the light beat signal B2. The phase difference between the two beat signals B1 and B2 is detected by the phase difference meter 45, and the relative shift of the positions of the mask 34 and the wafer 36 is calculated by the CPU 46. The mask 34 and the wafer 36 are positioned in accordance with the command signals from the mask driver circuit 47 and the wafer driver circuit 48 so that the relative shift of the positions of the mask 34 and the wafer 36 becomes zero.

If the initial phase of the s-polarized light U1 emitted from the laser light source 30 and having frequency f1 is $\phi 01$, the amplitude thereof is A, the initial phase of the p-polarized light having frequency f2 is $\phi 02$, and the amplitude thereof is B, then 1st-order diffracted light U1m from the diffraction grating 35 of the s-polarized light U1, 1st-order diffracted light U1w from the diffraction grating of the s-polarized light U1, −1st-order diffracted light U2m from the diffraction grating 35 of the p-polarized light U2 and −1st-order diffracted light U2w from the diffraction grating 37 of the p-polarized light U2 can be expressed as complex amplitudes by the following equations (13) to (16):

$$U1m = A \exp\{i(\omega 1 t + \phi 01 + \phi m)\} \tag{13}$$

$$U1w = A \exp\{i(\omega 1 t + \phi 01 + \phi w)\} \tag{14}$$

$$U2m = B \exp\{i(\omega 2 t + \phi 02 - \phi m)\} \tag{15}$$

$$U2w = B \exp\{i(\omega 2 t + \phi 02 - \phi w)\} \tag{16}$$

In the equations (13) to (16), $\omega 1$ and $\omega 2$ are angular frequencies, $\omega 1 = 2\pi f1$, and $\omega 2 = 2\pi f2$. $\phi m$ and $\phi w$ are phase changes which are respectively caused by shifts of the mask 34 and the wafer 36 in the x-axis direction. If Xm and Xw are shifts from the same reference position of gratings 35 and 37, respectively, $$\phi m = (2\pi/p \cos\theta) Xm$$

$$\phi w = (2\pi/p \cos\theta) Xw.$$

The constant p represents the pitch of the diffraction gratings 35 and 37, and $\theta$ is the angle between the x-axis and the direction of the grating lines of the diffraction gratings 35 and 37 as shown in FIG. 7. The change Im in the intensity of the beat signal B1 as a photoelectric detection output from the photodetector 43 and the change Iw in the intensity of the beat signal B2 as a photoelectric detection output from the photodetector 44 are as expressed by the following equations (17) and (18):

$$\begin{aligned} Im = & A^2 + B^2 + 2A \cdot B \\ & \cos\{(\omega 1 - \omega 2)t + (\phi 01 - \phi 02) + 2\phi m\} \end{aligned} \tag{17}$$

$$\begin{aligned} Iw = & A^2 + B^2 + 2A \cdot B \\ & \cos\{(\omega 1 - \omega 2)t + (\phi 01 - \phi 02) + 2\phi w\} \end{aligned} \tag{18}$$

When the phase shift ΔTmw between the beat signals expressed by the equations (17) and (18) is detected by the phase difference meter 45, the initial phases of the light beams ($\phi 01 - \phi 02$) are cancelled out and a result expressed by the following equation (19) is obtained:

$$\Delta Tmw = 2(\phi m - \phi w) = 4\pi/p \cos\theta(Xm - Xw) \tag{19}$$

Thus, the phase difference ΔTmw, proportional to the relative shift ΔX (≡Xm−Xw) of the mask 34 and the wafer 36 is obtained, and the mask 34 and the wafer 36 may be positioned in the x-axis direction by the driver circuits 47 and 48 so that phase difference ΔTmw becomes zero.

As shown in FIG. 7, the diameter D of spots of light for irradiating the diffraction gratings 35 and 37 from opposite sides, i.e., from mirrors 32 and 33 is selected so that each spot completely covers the diffraction gratings 35 and 37, and at least portions of the spots of incident light from the opposite sides are superposed. Also, the diffraction grating 35 on the mask 34 and the diffraction grating 37 on the wafer 36 are previously offset at a distance d from each other, and the edge of the edge mirror 42 for separating two light beam signals B1 and B2 may be placed in a position corresponding to the line L shown in FIG. 7.

In FIG. 6, the measuring system is illustrated with respect to the positioning in the x-axis direction alone. As a method of positioning in the y-axis direction, one of the following methods may be used:

(1) a method of rotating the mask 34 and the wafer 36 by 90°;

(2) a method of rotating the optical system (illumination and detection systems) by 90° ; and (3) a method of previously incorporating the illumination system for irradiation in the yz plane with light beams having frequencies f1 and f2, and detection and processing systems connected to this illumination system In these methods, the method (3) is preferable because it is free from the possibility of the occurrence of errors due to changes during rotation. In this embodiment, the method (3) is adopted, and a set of illumination, detection and processing systems, which is not illustrated in FIG. 6 but which is the same as that for measuring the shift in the x-axis direction, i.e., the set of the elements shown in FIG. 6 other than the mask 34 and the wafer 36, is disposed in a position rotated by 90° about the axis z with respect to the position of these elements in FIG. 6.

Light beams having frequencies f1 and f2 are provided so as to be incident upon the diffraction gratings 35 and 37 in the yz plane. Subsequently, in the same manner as the measurement of the positional error in the x-axis direction, diffracted light beams from the diffraction gratings 35 and 37 are independently led to interfere with each other, and two light beat signals B1 and B2 are obtained as photoelectrical detection outputs from the photodetectors 43 and 44. Thereafter, the phase difference between the two beat signals B1 and B2 is measured with the phase difference meter 45 to calculate the relative shift of the positions of the diffraction gratings 35 and 37 in the y-axis direction. If the shift of the diffraction grating 35 on the mask 34 in the y-axis direction from a reference line is Ym, the shift of the diffraction grating 37 on the wafer 36 in the y-axis direction from the same reference line is Yw, the distance at which the diffraction gratings 35 and 37 are offset from each other in the y-axis direction while being correctly positioned is d, then the measured phase difference $\Delta Ty$ is $$\Delta Ty = 4\pi/p \sin \theta (Ym - Yw),$$

and the relative shift $\Delta y$ of the mask 34 and the wafer 36 can be obtained as $$\Delta y = Ym - Yw - d = p \sin \theta / 4\pi \cdot \Delta Ty - d.$$

Positioning in the y-axis direction is performed by moving the mask 34 and the wafer 36 relative to each other so that $\Delta y = 0$, i.e., $\Delta Ty = (4\pi/p \sin \theta)d$.

Figure 8:
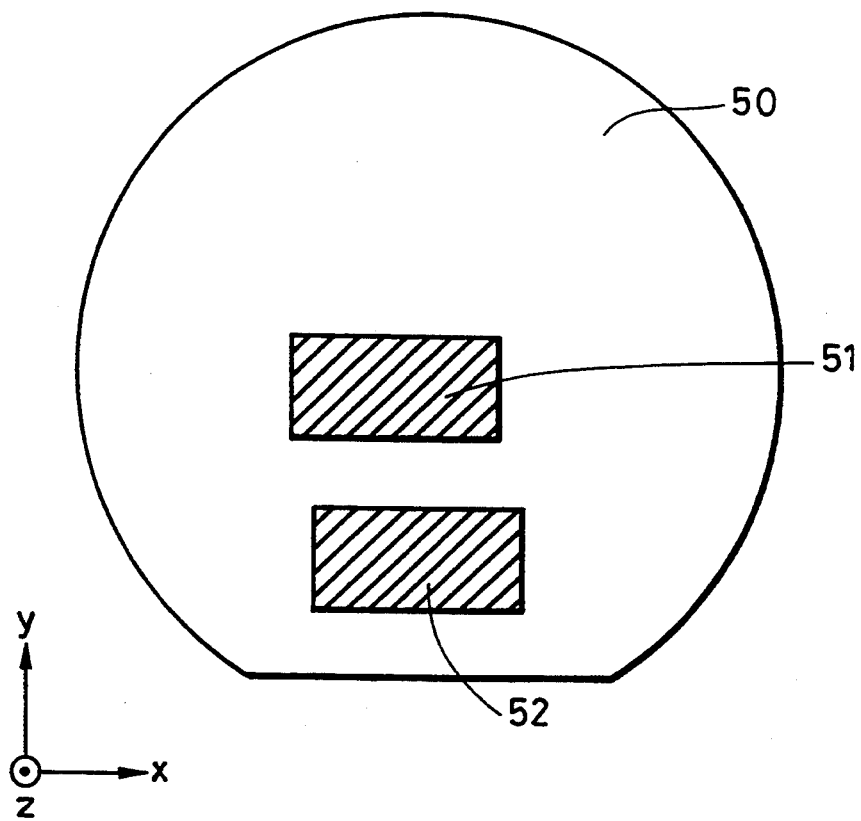
FIG. 8 is a diagram of a state of two diffraction gratings on a wafer in accordance with the present invention.

Another embodiment in which the present invention is applied to an apparatus for measuring the superposition accuracy of a semiconductor process is illustrated in FIG. 8. As shown in FIG. 8, a diffraction grating 51 is formed on a wafer by the semiconductor process, and another diffraction grating 52 is thereafter formed at a position adjacent to the diffraction grating 52 by the same process. As described above with respect to the first embodiment, two laser light beams of different frequencies are provided to irradiate the diffraction gratings 51 and 52 in the xz plane, and a relative shift in the x-axis direction is calculated from the phase difference between beat signals of diffracted light from the diffraction gratings 51 and 52. Two laser light beams of different frequencies are also led to the diffraction gratings 51 and 52 in the y-z plane, and a relative shift in the y-axis direction is calculated from the phase difference between beat signals of diffracted light from the diffraction gratings 51 and 52. A relative shift in the x-y plane caused at the time of the alignment step in the semiconductor process is thereby obtained. It is thereby possible to accurately determine whether or not the effect of the alignment is suitable.

Figure 9A:
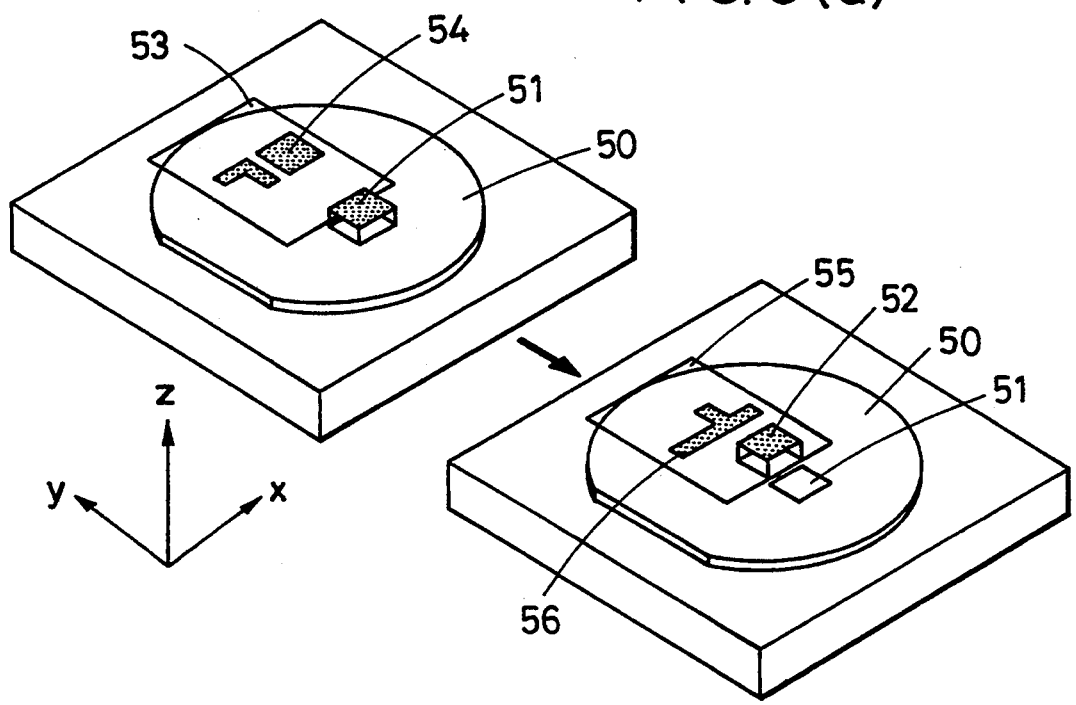
FIGS. 9(a) and 9(b) are schematic diagrams of methods of forming diffraction gratings in accordance with the present invention.

According to the present invention, as shown in FIG. 9(a), an error in two-dimensional alignment of integrated circuit (IC) patterns 54 and 56 can also be measured by forming a diffraction grating 51 together with the IC pattern 54 on a wafer 50 while placing the diffraction grating on a scribe line of a mask 53, forming a diffraction grating 52 together with the IC pattern 56 on the wafer 50 in the next forming process after grating 51 and pattern 54 are formed while placing the diffraction grating 52 on a scribe line of a mask 55, and measuring the two-dimensional relative shift of the positions of the two diffraction gratings 51 and 52 on the wafer.

Figure 9B:
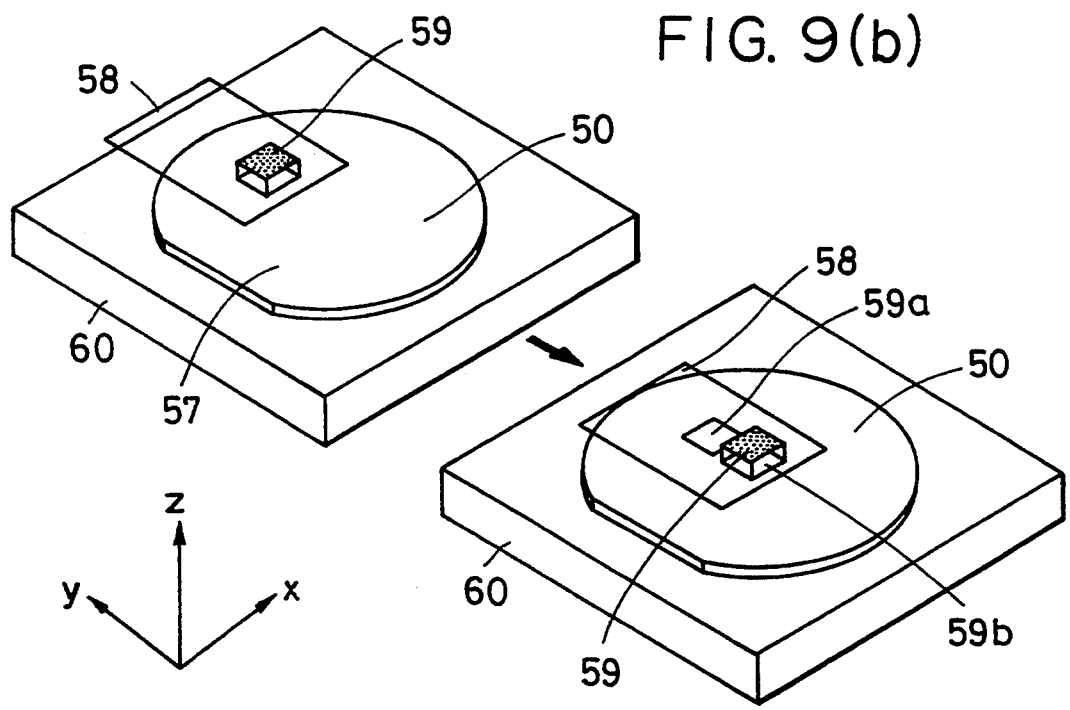

Also, as shown in FIG. 9(b), diffraction gratings 59a and 59b can be formed on a wafer 50 with adjacent resist patterns by applying a resist 57 to the wafer 50, performing exposure while placing a diffraction grating 59 on a mask 58, moving a wafer stage 60, on which the wafer 50 is disposed, in a direction along the xy plane to a predetermined extent, and thereafter performing exposure again. The accuracy with which the wafer stage 60 is moved can be determined by measuring the relative shift of the position of the two diffraction gratings 59 and 59b.

In each of the above-described embodiments, a Zeeman laser device which emits two-wavelength light beams is used as the illumination light source. Alternatively, two-wavelength light beams may be formed by using a combination of a laser light source for emitting a single-wavelength light beam, a beam splitter and an AOM or the like.

As described above, the position detector in accordance with the present invention can measure positional errors in two directions with a common diffraction grating having grating lines inclined with respect to position detecting directions. Thus, a high-accuracy position detector can be realized.

While the present invention has been described with respect to what presently are considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

The individual components represented by the blocks shown in FIGS. 1, 4, 5, and 6 are well known in the position detection art and their specific construction and operation are not critical to the invention or the best mode for carrying out the invention. Moreover, the steps recited in the specification for carrying out the invention can be easily programmed into well known central processing units by persons of ordinary skill and since such programming per se is not part of the invention, no further description thereof is deemed necessary.

What is claimed is:

1. A position detector comprising:
   a diffraction grating provided on a surface of an object, said diffraction grating having a plurality of grating lines extending in a grating line direction;
   an illumination system for causing a pair of light beams to be incident upon said diffraction grating along a plane extending in a first direction in which said diffraction grating extends, different from the grating line direction, for causing a first pair of diffraction light beams, diffracted by said diffraction grating, to travel in the same direction, so that the first diffraction light beams interfere with each other, said illumination system also for causing a pair of light beams to be incident upon said diffraction grating along a plane extending in a second direction in which said diffraction grating extends, different from the grating line direction, for causing a second pair of diffraction light beams, diffracted by said diffraction grating, to travel in the same direction, so that the second diffraction light beams interfere with each other;

a detection system for detecting interfering light from the first pair of diffraction light beams and for generating a first beat signal therefrom, said detection system also for detecting interfering light from the second pair of diffraction light beams and for generating a second beat signal therefrom; and a processing system for detecting position information with respect to the first direction of said diffraction grating from the phase state of the first beat signal, said processing system also for detecting position information with respect to the second direction of said diffraction grating from the phase state of the second beat signal.

2. A position detector according to claim 1, wherein said first and second directions are perpendicular to each other, and wherein the grating line direction is inclined approximately at an angle of 45° from the first and second directions.

3. A position detector according to claim 1, wherein said illumination system comprises a single Zeeman laser light source, a single beam splitter and at least one mirror, and wherein one of said illumination and detection systems and the object is rotated by an angle of 90° to enable the first and second pairs of light beams to be incident upon said diffraction grating.

4. A position detector comprising:
a diffraction grating provided on a surface of an object, said diffraction grating having a plurality of grating lines extending in a grating line direction;
an illumination system for causing a pair of light beams to be incident upon said diffraction grating along plane extending in a first direction in which said diffraction grating extends, different from the grating line direction, for causing a first pair of diffraction light beams, diffracted by said diffraction grating, to travel in the same direction, so that the first diffraction light beams interfere with each other, said illumination system also for causing a pair of light beams to be incident upon said diffraction grating along a plane extending in a second direction in which said diffraction grating extends, different from the grating line direction, for causing a second pair of diffraction light beams, diffracted by said diffraction grating, to travel in the same direction, so that the second diffraction light beams interfere with each other;

a detection system for detecting interfering light from the first pair of diffraction light beams and for generating a first beat signal therefrom, said detection system also for detecting interfering light from the second pair of diffraction light beams and for generating a second beat signal therefrom;

comparison beat signal formation means for extracting a part of the first pair of light beams to form a third beat signal and for extracting a part of the second pair of light beams to form a fourth beat signal; and a processing system for detecting position information with respect to the first direction of said diffraction grating from the phase difference between the first and third beat signals, said processing system also for detecting position information with respect to the second direction of said diffraction grating from the phase difference between the second and fourth beat signals.

5. A position detector according to claim 4, wherein said comparison beat signal formation means causes a part of each of the first and second pairs of light beams to be incident upon a comparison diffraction grating provided at a position different from that of said diffraction grating, and forms the third and fourth beat signals from diffracted light from said comparison diffraction grating.

6. A position detector according to claim 4, wherein the first and second directions are perpendicular to each other, and wherein the grating line direction is inclined approximately at an angle of 45° from the first and second directions.

7. A position detector according to claim 4, wherein said said illumination system comprises a single Zeeman laser light source, a single beam splitter and at least one mirror, and one of said illumination and detection systems and the object is rotated by an angle of 90° to enable the first and second pairs of light beams to be incident upon said diffraction grating.

* * * * *

UNITED STATES PATENT AND TRADEMARK OFFICE
CERTIFICATE OF CORRECTION

PATENT NO. : 5,369,486
DATED : November 29, 1994
INVENTOR(S) : TAKAHIRO MATSUMOTO, et al.

It is certified that error appears in the above-indentified patent and that said Letters Patent is hereby corrected as shown below:

<u>COLUMN 3</u>

Line 9, "is" (second occurrence) should be deleted.

<u>COLUMN 10</u>

Line 68, "system" should read --system.--.

<u>COLUMN 13</u>

Line 41, "along " should read --along a--.

<u>COLUMN 14</u>

Line 42, "said" (second occurrence) should be deleted.

Signed and Sealed this

Second Day of May, 1995

Attest:

BRUCE LEHMAN

*Attesting Officer*  *Commissioner of Patents and Trademarks*